STABILIZED UNILATERAL NEGATIVE-RESISTANCE AMPLIFIER

Filed May 4, 1962

PRIOR ART

INVENTOR.
BENT CHRISTENSEN
BY
Fordyce A. Bothwell
ATTORNEY

United States Patent Office 3,160,823

Patented Dec. 8, 1964

3,160,823

STABILIZED UNILATERAL NEGATIVE-RESISTANCE AMPLIFIER

Bent Christensen, Mountain View, Calif., assignor to Philco Corporation, Philadelphia, Pa., a corporation of Delaware Filed May 4, 1962, Ser. No. 192,431
7 Claims. (Cl. 330—6)

This invention relates to unilateral amplifiers, i.e. amplifiers which transmit signals in one direction and have substantially zero transmissivity in the opposite or reverse direction.

More particularly this invention relates to unilateral negative-resistance amplifiers employing a Hall effect gyrator and shunting resistors having negative resistance, as hereinafter more fully discussed.

The principal object of this invention is to provide an improved amplifier of this type which has greater stability and is operable over a wide band of frequencies which may extend up into the microwave range.

In accordance with this invention, tunnel diodes are employed as shunting resistors in conjunction with a Hall effect gyrator to constitute a unilateral negative-resistance amplifier. The tunnel diodes are biased to their negative resistance region, and the bias is automatically maintained by a servo control arrangement. The latter involves reverse transmission of a pilot signal and control of the diode bias accordingly to maintain substantially zero reverse transmission of signal by the amplifier.

Figure 1:
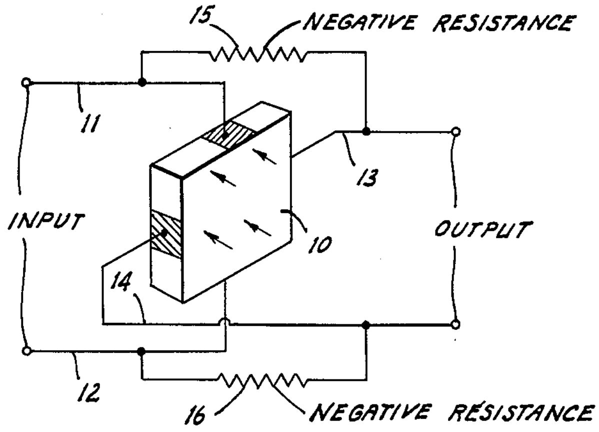
Figure 2:
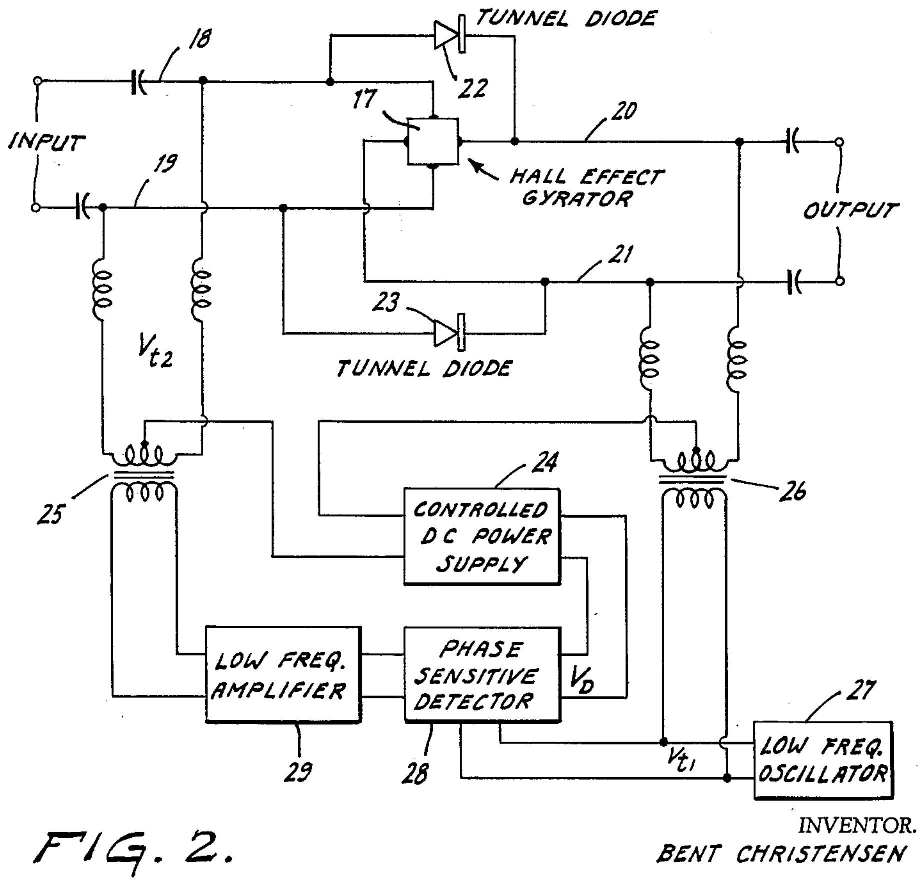

The invention may be fully understood from the following detailed description with reference to the accompanying drawing wherein FIG. 1 is a diagrammatic illustration of a prior art unilateral amplifier of the type here involved; and FIG. 2 is a schematic illustration of a unilateral negative-resistance amplifier according to this invention.

The Hall effect gyrator is a known device which does not require detailed description. It suffices to note that one form of this device, as shown in FIG. 1, comprises a square slab 10 of semiconductor material, a pair of input leads 11 and 12 connected to opposite edge faces of the slab through ohmic contacts, and a pair of output leads 13 and 14 connected respectively to the other two opposed edge faces through ohmic contacts. A constant magnetic field is applied perpendicular to the slab as represented by the arrows. To constitute a unilateral negative-resistance amplifier, two shunting resistors 15 and 16 having negative resistance are connected to said leads as shown.

In a unilateral negative-resistance amplifier of this type, the unilateral transfer characteristic is dependent on the shunting negative resistances which, however, are subject to change due to aging and ambient temperature change.

Referring now to FIG. 2, there is shown a unilateral negative-resistance amplifier according to this invention in which the proper negative resistance values are automatically maintained. As in the prior art amplifier of FIG. 1, a Hall effect gyrator 17 is provided having input leads 18 and 19 and output leads 20 and 21. Tunnel diodes 22 and 23 are connected to serve as the shunting resistors. As is well known a tunnel diode has a negative-resistance operating region to which it can be biased. In this instance the tunnel diodes are biased to their negative-resistance region from a controlled D.C. power supply 24 which is part of a servo control arrangement now to be described.

The amplifier serves to amplify high frequency signals which are applied to the input terminals, and the servo control arrangement utilizes a low frequency pilot signal.

A first transformer 25 has its primary winding connected to the input leads 18 and 19. A second transformer 26 has its secondary winding connected to the output leads 20 and 21. The bias from source 24 is applied to the tunnel diodes through center taps on said windings. A low frequency pilot signal is supplied from an oscillator 27 to the primary winding of transformer 26 and also to a phase detector 28. If the bias on the tunnel diodes at any particular instant is not such as to give substantially zero reverse transmission of the pilot signal, the latter will appear at transformer 25 and will be amplified by amplifier 29 and applied to the phase detector 28. The latter will then supply a corrective voltage to the power supply 24 so as to reduce the reverse transmission substantially to zero. The purpose of the capacitors and choke coils is of course to maintain separation of the high frequency signal and the low frequency pilot signal.

The circuit operates in the following manner. A low-frequency signal, $V_{t1}$, from the low-frequency oscillator 27 is impressed upon leads 20 and 21. The low frequency output signal, $V_{t2}$, at leads 18 and 19 is a function of the reverse transfer admittance $y_{tr}$. Let $y_{tr}=0$ when the D.C. bias voltage $V_B$ of the tunnel diodes equal $V_0$. For values of $V_B$ in the neighborhood of $V_0$ we have $$V_{t2} \cong k_1(V_0-V_B)V_{t1} \qquad (1)$$

where $k_1$ is a constant.

The voltage $V_{t2}$ is amplified and is rectified by the phase sensitive detector. Let the D.C. output of the detector be denoted $V_D$. Then $$V_D \cong k_1k_2(V_0-V_B)V_{t1} \qquad (2)$$

where $k_2$ is a constant depending on the amplifier gain and the characteristics of the detector.

The voltage $V_D$ controls the D.C. output of the D.C. power supply.

Assume that $$V_B=V_{B0}+k_3V_D \qquad (3)$$

where $V_{B0}$ and $k_3$ are constants.

Solving Equations 2 and 3 for $V_B$ yields $$V_B \cong \frac{V_{B0}+k_1k_2k_3V_{t1}V_0}{1+k_1k_2k_3V_{t1}} \qquad (4)$$

Thus $V_B \cong V_0$ and consequently $y_{tr} \cong 0$, if $k_1k_2k_3V_{t1} >> 1$ and $$\frac{V_{B0}}{V_0}$$

Thus the control circuit will adjust the bias on the tunnel diodes to a value which will be very close to the value required to make the reverse transfer equal to zero. Therefore the negative-resistance amplifier will have an essentially unilateral transfer from the input to the output.

While the invention has been described with reference to a specific embodiment, it will be understood that the invention is not limited thereto but contemplates such modifications and further embodiments as may occur to those skilled in the art.

I claim:

1. A stabilized unilateral amplifier, comprising a Hall effect gyrator having a pair of input leads and a pair of output leads, a pair of tunnel diodes, one of said diodes being connected between one of said input leads and one of said output leads, and the other diode being connected between the other input lead and the other output lead, means for biasing said diodes to their negative-resistance region, and means connected to said input leads and responsive to signals transmitted from said output leads to said input leads through said amplifier for controlling the bias on said diodes so as to maintain substantially zero reverse transmission of signal by the amplifier.

2. A stabilized unilateral amplifier, comprising a Hall effect gyrator having a pair of input leads and a pair of output leads, a pair of tunnel diodes, one of said diodes being connected between one of said input leads and one of said output leads, and the other diode being connected between the other input lead and the other output lead, means for biasing said diodes to their negative-resistance region, means for applying a pilot signal to said output leads, means for deriving reverse-transmitted pilot signal from said input leads, and means responsive to the applied and derived pilot signal for controlling the bias on said diodes so as to maintain substantially zero reverse transmission of signal by the amplifier.

3. A stabilized unilateral amplifier for amplifying high-frequency signals, comprising a Hall effect gyrator having a pair of input leads and a pair of output leads, a pair of tunnel diodes, one of said diodes being connected between one of said input leads and one of said output leads, and the other diode being connected between the other input lead and the other output lead, means for biasing said diodes to their negative-resistance region, means for applying a low-frequency pilot signal to said output leads, means for deriving reverse-transmitted low-frequency pilot signal from said input leads, and means responsive to the applied and derived low-frequency pilot signal for controlling the bias on said diodes so as to maintain substantially zero reverse transmission of signal by the amplifier.

4. A stabilized unilateral amplifier for amplifying high-frequency signals, comprising a Hall effect gyrator having a pair of input leads and a pair of output leads, a pair of tunnel diodes, one of said diodes being connected between one of said input leads and one of said output leads, and the other diode being connected between the other input lead and the other output lead, a biasing source connected across both of said diodes for biasing said diodes to their negative-resistance region, means for applying a low-frequency pilot signal to said output leads, means for deriving reverse-transmitted low-frequency pilot signal from said input leads, and means responsive to the applied and derived low-frequency pilot signal for controlling said biasing source so as to maintain substantially zero reverse transmission of signal by the amplifier.

5. A stabilized unilateral amplifier for amplifying high-frequency signals, comprising a Hall effect gyrator having a pair of input leads and a pair of output leads, a pair of tunnel diodes, one of said diodes being connected between one of said input leads and one of said output leads, and the other diode being connected between the other input lead and the other output lead, a first transformer having its primary winding connected across said input leads, a second transformer having its secondary winding connected across said output leads, a biasing source connected between center taps on said windings for biasing said diodes to their negative-resistance region, means for applying a low-frequency pilot signal to the primary winding of said second transformer, means for deriving reverse-transmitted low-frequency pilot signal from the secondary winding of said first transformer, and means responsive to the applied and derived low-frequency pilot signal for controlling said biasing source so as to maintain substantially zero reverse transmission of signal by the amplifier.

6. A stabilized unilateral amplifier for amplifying high-frequency signals, comprising a Hall effect gyrator having a pair of input leads and a pair of output leads, a pair of tunnel diodes, one of said diodes being connected between one of said input leads and one of said output leads, and the other diode being connected between the other input lead and the other output lead, a biasing source connected across both of said diodes for biasing said diodes to their negative-resistance region, a phase-sensitive detector having its output connected to said source to control the same, means for applying a low-frequency pilot signal to said output leads and to said detector, means for deriving reverse-transmitted low-frequency pilot signal from said input leads, and means for applying the latter signal to said detector to effect control of said source so as to maintain substantially zero reverse transmission of signal by the amplifier.

7. A stabilized unilateral amplifier for amplifying high-frequency signals, comprising a Hall effect gyrator having a pair of input leads and a pair of output leads, a pair of tunnel diodes, one of said diodes being connected between one of said input leads and one of said output leads, and the other diode being connected between the other input lead and the other output lead, a first transformer having its primary winding connected across said input leads, a second transformer having its secondary winding connected across said output leads, a biasing source connected between center taps on said windings for biasing said diodes to their negative-resistance region, a phase sensitive detector having its output connected to said source to control the same, means for applying a low-frequency pilot signal to said output leads and to said detector, means for deriving reverse-transmitted low-frequency pilot signal from said input leads, and means for applying the latter signal to said detector to effect control of said source so as to maintain substantially zero reverse transmission of signal by the amplifier.

References Cited in the file of this patent

UNITED STATES PATENTS

| | | |
|---|---|---|
| 2,775,658 | Mason et al. | Dec. 25, 1956 |
| 2,794,864 | Shockley | June 4, 1957 |
| 3,098,973 | Wickersham et al. | July 23, 1963 |

FOREIGN PATENTS

| | | |
|---|---|---|
| 1,120,503 | Germany | Dec. 28, 1961 |